US006837605B2

(12) United States Patent
Reill

(10) Patent No.: US 6,837,605 B2
(45) Date of Patent: Jan. 4, 2005

(54) LED ILLUMINATION SYSTEM

(75) Inventor: Joachim Reill, Zeitlarn (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/306,437

(22) Filed: Nov. 27, 2002

(65) Prior Publication Data
US 2003/0099115 A1 May 29, 2003

Related U.S. Application Data
(60) Provisional application No. 60/352,251, filed on Jan. 28, 2002.

(30) Foreign Application Priority Data
Nov. 28, 2001 (DE) .......................................... 101 58 395

(51) Int. Cl.⁷ .............................................. F21V 7/04
(52) U.S. Cl. ...................... 362/555; 362/255; 362/800
(58) Field of Search ................................ 362/555, 237, 362/255, 245, 236, 800

(56) References Cited

U.S. PATENT DOCUMENTS 4,935,665 A * 6/1990 Murata ........................ 313/500
RE34,254 E * 5/1993 Dragoon ....................... 362/307
5,813,752 A * 9/1998 Singer et al. ................ 362/293
6,333,779 B1 12/2001 Tabata et al.
6,481,130 B1 * 11/2002 Wu ................................. 40/546
6,483,439 B1 * 11/2002 Vukosic .................. 340/815.65
6,502,956 B1 * 1/2003 Wu ............................... 362/237

FOREIGN PATENT DOCUMENTS

EP    1 017 222 A2    7/2000

* cited by examiner

Primary Examiner—John Anthony Ward
(74) Attorney, Agent, or Firm—Laurence A. Greenberg; Werner H. Stemer; Gregory L. Mayback

(57) ABSTRACT

In an LED illumination system for illuminating a surface (5) with a predetermined illumination distribution, comprising at least one LED semiconductor body (2) which emits light symmetrical to a main beam direction (9) of the LED semiconductor body (2), illumination optics (4) are disposed between the at least one LED semiconductor body (2) and the surface (5) that is to be illuminated, which optics deflect the emitted light (6) asymmetrically relative to the main beam direction (9) of the LED semiconductor body (2). This makes it possible to purposely adjust the illumination of the surface (5) regardless of its shape.

18 Claims, 2 Drawing Sheets

US 6,837,605 B2

LED ILLUMINATION SYSTEM

This application claims the benefit of Provisional application Ser. No. 60/352,251, filed Jan. 28, 2002.

The invention relates to the field of illumination systems and particularly to an LED illumination system for illuminating a surface with a defined intensity distribution, with at least one LED semiconductor body which emits light symmetrically to a main beam direction of the LED semiconductor body.

The European patent application EP-A-1 017 222 describes an illumination device which comprises a plurality of light sources and a light conductor which guides the emitted light along its longitudinal direction and emits it onto an illuminated object. The emitting surface of the light conductor has the form of a lens, and light can thus be bundled onto the location of the illuminated object with high intensity.

Such illumination systems are designed for illuminating a more or less extensive object, for instance for purposes of scanning or imaging the object. The light is focused on the object to the greatest extent possible in order to be able to provide the illumination with minimal light output.

In contrast, an illumination system which is employed for illuminating extensive surfaces must satisfy different requirements. The illumination system should be able to irradiate the area with a defined predetermined distribution of illumination intensity. For instance, text or color displays on the illuminated surface require a substantially uniform illumination so that reading of the text is not made unduly difficult and so that color contrasts which are not actually there are not simulated in the color display.

Conventional illumination systems either deliver inadequate results or have a complex and expensive construction.

The object of the present invention is to provide an LED illumination system of the above type with which a surface can be illuminated with a predetermined homogenous illumination intensity distribution, and which has a simple construction and is inexpensive to produce.

This object is achieved by the LED illumination system with the features of claim 1. Further developments of the invention emerge from the subclaims.

According to the invention, illuminating optics are disposed in an LED illumination system between the at least one LED semiconductor body and the surface that is to be illuminated, which optics deflect the emitted light asymmetrically relative to the main beam direction of the LED semiconductor body.

The asymmetrical deflection makes possible a purposeful setting of the illumination of the surface, regardless of the shape of said surface. Thus, the changing distance to the surface points from the light source and the changing angle at which the light beams strike the surface can be accounted for, given a surface of any shape, by the asymmetric beam deflection of the symmetrically emitted light.

In a development, the illumination system is designed for the uniform illumination of a surface.

In particular, the illumination system can be designed for the uniform illumination of a curved surface, particularly a convex or concave surface.

But it is also possible to utilize the illumination system for the purposeful non-uniform illumination of the surface, for instance so that specific regions of the surface can be optically highlighted or left in the background.

In an advantageous development, the illumination optics are formed by one or more single lenses. If the illumination surface is concave from the perspective of the single lens, the single lens has a concave surface with respect to the LED and a convex surface with respect to the illumination surface.

But corresponding illumination optics can also be formed by one or more Fresnel lenses.

In a preferred development, the illumination system comprises several LED semiconductor bodies which emit in different spectral ranges.

In a particularly expedient development, the light of the LED semiconductor body which is emitted in different spectral ranges is complementary, (i.e. white light is delivered); for instance, three LED semiconductor bodies are provided, one of which emits red light, one green light, and one blue light.

The LED semiconductor body or bodies contain GaN, InGaN, AlGaN, ZnS, InAlGaN, ZnSe, CdZnS, or CdZnSe semiconductor material and emit visible light or infrared or ultraviolet electromagnetic radiation.

An alternative for generating white light in the illumination system utilizes one or more luminescence conversion elements behind the semiconductor body (or bodies) in its emission direction, which are interposed between the semiconductor body and the lens. Suitable for this purpose is a luminescence conversion element which, if a semiconductor body emits blue light, for instance, converts a portion of the blue light into yellow light or into green light and red light and which blends these with the blue light of the semiconductor body.

In a development, the LED semiconductor body and the illumination optics form an illumination module and are disposed in a common module housing.

One wall of the module housing can be formed by a Fresnel lens which is a component of the illumination optics. Of course, the Fresnel lens can also represent the only lens needed for the illumination optics. In that case, the structure of the illumination system is particularly simple and compact.

Further advantageous developments, features and details of the invention emerge from the dependent claims, the description of the exemplifying embodiments, and the drawings.

Exemplifying embodiments of the invention will now be described in connection with the drawings. Only the elements which are essential for understanding the invention are represented. Shown are:

FIG. 1: a schematic representation of a sectional view of an LED illumination system according to a first exemplifying embodiment of the invention;

FIG. 2: a schematic representation of a sectional view of an LED illumination system according to a second exemplifying embodiment of the invention;

FIG. 3: a schematic sectional view through a preferred LED element for the illumination system.

The LED illumination system 1 according to the exemplifying embodiment, which is schematically represented in section in FIG. 1, is provided for an optimally uniform illumination of a curved surface 5, for instance of a chart.

An LED element 2 on a carrier 3 emits the light needed for illumination during operation. It is immediately apparent to the person skilled in the art that, absent correction of the emitted light, the illumination of the curved surface 5 is not uniform, for several reasons.

First, the emission characteristic of the LED element 2 is not constant over the entire space angle $\Omega$ occupied by the curved surface 5; rather, it has its maximum intensity in an angle range about the main beam direction 9. Secondly, the distance to the curved surface 5 from the LED element 2 changes; and thirdly, the angle of incidence of the incident radiation also changes with the curvature of the surface 5 along its longitudinal extent.

In order to achieve a substantially uniform illumination of the curved surface 5 nevertheless, a lens 4 is disposed between this and the LED element 2 as illumination optics, which lens correspondingly deflects the emitted light asymmetrically in relation to the main beam direction 9 of the LED element 2.

The light emitted by the LED element 2, which is represented by the geometric light beams 6 indicated by arrows in FIG. 1, has an at least approximately symmetrical intensity distribution relative to the main beam direction 9. The illumination optics 4 deflect the light beams 6 such that they strike the curved surface 5 as asymmetrically distributed light beams 8. To that end, the illumination optics 4 consist of an asymmetrically shaped lens 4 with a concave surface 41 facing the LED element 2 and a convex, for instance parabolically convex, surface 42 facing the curved surface 5.

The measure of deflection by the lens 4 is proportioned to compensate the above described effects and others which would lead to a non-uniform illumination of the curved surface 5, so that there results a uniform illumination intensity of the curved surface 5. This compensation can occur by way of the selection of the curvature of the outer lens surface 42 and inner lens surface 41, as is known per se from the prior art.

The overall arrangement of the LED element 2 and the illumination optics 4 is preferably accommodated in a common module housing 7.

Though the exemplifying embodiment of FIG. 1 has been described with only one LED element for the sake of simplicity, it is obvious to the person skilled in the art that a number of LED elements can also be provided in the illumination system instead of the single LED element. In particular, the LED elements can emit different spectral colors in order to achieve a desired color impression on the illuminated surface 5.

This is exemplarily realized in the illumination system 11 of FIG. 2, which represents another exemplifying embodiment of the invention. The three LED elements 12a, 12b, 12c emit in the red (650 nm), green (530 n), and blue (470 nm) spectral ranges, respectively, producing an overall emission of white light. Alternatively, a blue LED can be employed in conjunction with a converter material for converting the blue light into longer-wave radiation for the purpose of white light emission.

The three LED elements 12a–c are installed on a carrier 3 and, like the illumination system 1, intended for the purpose of illuminating a surface which is not illustrated in FIG. 2.

The illumination optics which generate the desired illumination intensity on the illuminated surface are formed by a Fresnel lens 14 in this embodiment A very flat lens construction can be realized by partitioning the Fresnel lens 14 into radial zones with an approximately equal maximum thickness.

The Fresnel lens 14 can thus form a wall of the module housing 17, and a compact, self-contained construction of the illumination system is realized. The Fresnel lens 14 can simply be replaced by a correspondingly suitable Fresnel lens when another distribution pattern of illumination intensity is wanted.

Commercial surface-mountable LED components are utilized as LED elements 2, 12a–b for the above described exemplifying embodiments and for the invention in general. One such component is schematically represented in FIG. 3. At least one LED semiconductor body 20 is therein arranged in an LED plastic housing 21. The LED semiconductor body 20 is advantageously located in a reflector device 22 of the LED plastic housing 21, which bundles the light emitted by the LED semiconductor body 20. Alternatively or additionally to the reflector device 22, a collecting lens 23, preferably a lens which is fixed on the LED's plastic housing 21, can be disposed behind the semiconductor body 20 in the direction of emission for the purpose of bundling the light which is emitted by the LED semiconductor body 20.

Alternatively, one or several LED semiconductor chips without a housing can be mounted directly in the illumination module on a chip carrier 3 as the LED element. But the module housing 7 must then satisfy higher requirements with respect to tightness than if LED components which are provided with a housing are utilized as described in connection with FIG. 3.

What is claimed is:

1. An LED illumination system for illuminating a surface with a predetermined illumination intensity distribution, the LED illumination system comprising:
   at least one LED element emitting light symmetrically relative to a main beam direction of said LED element; and
   illumination optics disposed between said LED element and the surface to be illuminated, said illumination optics having a concave surface facing said LED element, a convex surface facing the surface to be illuminated, and deflecting emitted light asymmetrically relative to the main beam direction of said LED element.

2. The LED illumination system according to claim 1, wherein the LED illumination system is configured and intended for a uniform illumination of the surface to be illuminated.

3. The LED illumination system according to claim 1, wherein the LED illumination system is configured and intended for a uniform illumination of a curved surface.

4. The LED illumination system according to claim 3, wherein said illumination optics is formed by an individual lens.

5. The LED illumination system according to claim 3, wherein the curved surface is one of a convex surface and a concave surface.

6. The LED illumination system according to claim 1, wherein said illumination optics include at least one Fresnel lense.

7. The LED illumination system according to claim 1, wherein said LED element contains a semiconductor material selected from the group consisting of GaN, InGaN, AlGaN, InAl, GaN, ZnS, ZnSe, CdZnS, and CdZnSe.

8. The LED illumination system according to claim 1, wherein said LED element is a plurality of LED elements and one of said LED elements emits one of visible light, infrared electromagnetic radiation, and ultraviolet electromagnetic radiation during operation.

9. The LED illumination system according to claim 1, wherein said LED element is one of a plurality of LED elements and several of said LED elements emit in different spectral ranges.

10. The LED illumination system according to claim 9, wherein the emitted light of said LED elements is complementary, and white light is delivered.

11. The LED illumination system according to claim 1, further comprising a common module housing, and said LED element and said illumination optics form an illumination module and are disposed in said common module housing.

12. The LED illumination system according to claim 11, wherein said illumination optics contains a Fresnel lens which forms a wall of said common module housing.

13. The LED illumination system according to claim 1, wherein said LED element is a surface-mountable LED component with a LED plastic housing.

14. The LED illumination system according to claim 13, wherein said LED plastic housing contains a reflector device in which said LED element is disposed.

15. The LED illumination system according to claim 13, wherein said illumination optics is a collecting lens disposed downstream of said LED element in a direction of emission.

16. The LED illumination system according to claim 15, wherein said collecting lens is disposed on said LED plastic housing.

17. The LED illumination system according to claim 1, wherein said convex surface is a convex parabola.

18. An LED illumination system comprising:

at least one LED element having a surface-mountable LED component with a LED plastic housing, said at least one LED element emitting light symmetrically relative to a main beam direction of said LED element; and illumination optics disposed between said LED element and a curved surface to be illuminated, said illumination optics deflecting emitted light asymmetrically relative to the main beam direction of said LED element to illuminate said curved surface with a substantially uniform illumination intensity distribution.

* * * * *

UNITED STATES PATENT AND TRADEMARK OFFICE
CERTIFICATE OF CORRECTION

PATENT NO. : 6,837,605 B1  
APPLICATION NO. : 10/306437  
DATED : January 4, 2005  
INVENTOR(S) : Reill Page 1 of 4

It is certified that error appears in the above-identified patent and that said Letters Patent is hereby corrected as shown below:

Please delete the specification and claims columns 1 line 1 through columns 6 line 16 and insert the specifications and claims columns 1 line 1 through columns 6 lines 40 as attached.

Signed and Sealed this

First Day of April, 2008

JON W. DUDAS  
*Director of the United States Patent and Trademark Office*

LED ILLUMINATION SYSTEM

CROSS-REFERENCE TO RELATED APPLICATION

This application claims the benefit under 35 U.S.C. § 119(e) of now abandoned provisional application no. 60/352,251, filed Jan. 28, 2002.

BACKGROUND OF THE INVENTION

Field of the Invention

The invention relates to the field of illumination systems and particularly to an LED illumination system for illuminating a surface with a defined intensity distribution, and with at least one LED semiconductor body that emits light symmetrically to a main beam direction of the LED semiconductor body.

Published, European patent application EP 1 017 222 A, corresponding to U.S. Pat. No. 6,333,779, describes an illumination device which contains a plurality of light sources and a light conductor which guides the emitted light along its longitudinal direction and emits it onto an illuminated object. An emitting surface of the light conductor has the form of a lens, and light can thus be bundled onto the location of the illuminated object with high intensity.

Such illumination systems are configured for illuminating a more or less extensive object, for instance for purposes of scanning or imaging the object. The light is focused on the object to the greatest extent possible in order to be able to provide the illumination with minimal light output.

In contrast, an illumination system which is employed for illuminating extensive surfaces must satisfy different requirements. The illumination system should be able to irradiate the area with a defined predetermined distribution of illumination intensity. For instance, text or color displays on the illuminated surface require a substantially uniform illumination so that the reading of the text is not made unduly difficult and so that color contrasts that are not actually there are not simulated in the color display.

Conventional illumination systems either deliver inadequate results or have a complex and expensive construction.

SUMMARY OF THE INVENTION

It is accordingly an object of the invention to provide a LED illumination system that overcomes the above-mentioned disadvantages of the prior art devices of this general type, with which a surface can be illuminated with a predetermined homogenous illumination intensity distribution, and which has a simple construction and is inexpensive to produce.

With the foregoing and other objects in view there is provided, in accordance with the invention, an LED illumination system for illuminating a surface with a predetermined illumination intensity distribution. The LED illumination system contains at least one LED element emitting light symmetrically relative to a main beam direction of the LED element, and illumination optics disposed between the LED element and the surface to be illuminated. The illumination optics deflects emitted light asymmetrically relative to the main beam direction of the LED element.

According to the invention, illuminating optics are disposed in the LED illumination system between the LED semiconductor body and the surface that is to be illuminated, which optics deflect the emitted light asymmetrically relative to the main beam direction of the LED semiconductor body.

The asymmetrical deflection makes possible a purposeful setting of the illumination of the surface, regardless of the shape of the surface. Thus, the changing distance to the surface points from the light source and the changing angle at which the light beams strike the surface can be accounted for, given a surface of any shape, by the asymmetric beam deflection of the symmetrically emitted light.

In a development, the illumination system is configured for the uniform illumination of a surface.

In particular, the illumination system can be configured for the uniform illumination of a curved surface, particularly a convex or concave surface.

But it is also possible to utilize the illumination system for the purposeful non-uniform illumination of the surface, for instance so that specific regions of the surface can be optically highlighted or left in the background.

In an advantageous development, the illumination optics are formed by one or more single lenses. If the illumination surface is concave from the perspective of the single lens, the single lens has a concave surface with respect to the LED and a convex surface with respect to the illumination surface.

But corresponding illumination optics can also be formed by one or more Fresnel lenses.

In a preferred development, the illumination system contains several LED semiconductor bodies that emit in different spectral ranges.

In a particularly expedient development, the light of the LED semiconductor body which is emitted in different spectral ranges is complementary, (i.e. white light is delivered); for instance, three LED semiconductor bodies are provided, one of which emits red light, one green light, and one blue light.

The LED semiconductor body or bodies contain GaN, InGaN, AlGaN, ZnS, InAlGaN, ZnSe, CdZnS, or CdZnSe semiconductor material and emit visible light or infrared or ultraviolet electromagnetic radiation.

An alternative for generating white light in the illumination system utilizes one or more luminescence conversion elements behind the semiconductor body (or bodies) in its emission direction, which are interposed between the semiconductor body and the lens. Suitable for this purpose is a luminescence conversion element which, if a semiconductor body emits blue light, for instance, converts a portion of the blue light into yellow light or into green light and red light and which blends these with the blue light of the semiconductor body.

In a development, the LED semiconductor body and the illumination optics form an illumination module and are disposed in a common module housing.

One wall of the module housing can be formed by a Fresnel lens that is a component of the illumination optics. Of course, the Fresnel lens can also represent the only lens needed for the illumination optics. In that case, the structure of the illumination system is particularly simple and compact.

In accordance with an added feature of the invention, the LED element is a plurality of LED elements and one of the LED elements emits visible light, infrared electromagnetic radiation, or ultraviolet electromagnetic radiation during operation.

In accordance with an additional feature of the invention, the emitted light of the LED elements is complementary, and white light is delivered.

In accordance with a further feature of the invention, the LED element is a surface-mountable LED component with a LED plastic housing. The LED plastic housing contains a reflector device in which the LED element is disposed. The illumination optics is a collecting lens disposed downstream of the LED element in a direction of emission. The collecting lens is disposed on the LED plastic housing.

Other features which are considered as characteristic for the invention are set forth in the appended claims.

Although the invention is illustrated and described herein as embodied in a LED illumination system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
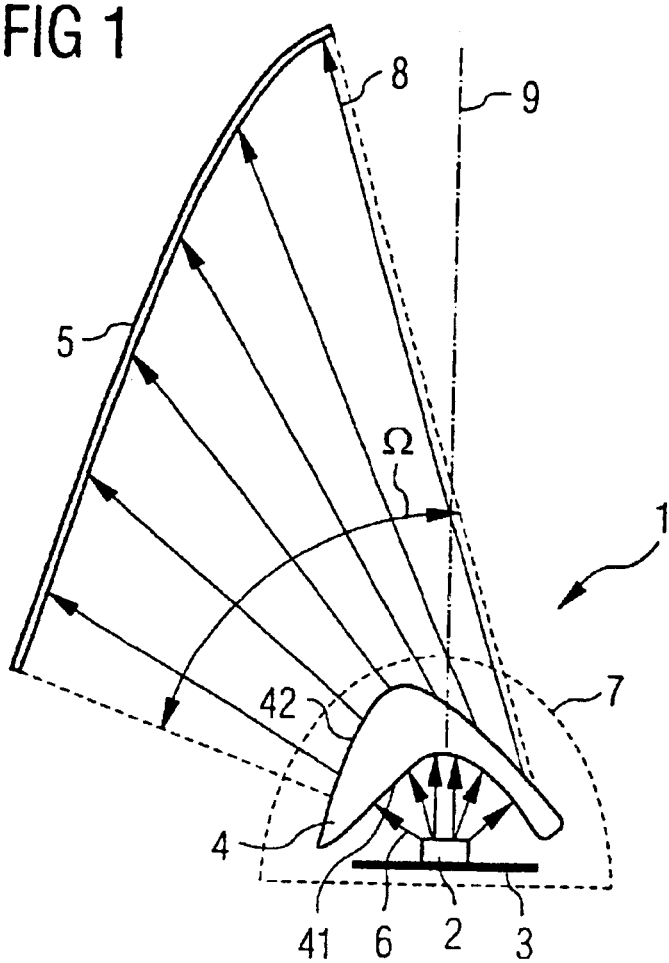
FIG. 1 is a diagrammatic, sectional view of an LED illumination system according to a first exemplifying embodiment of the invention.

Referring now to the figures of the drawing in detail and first, particularly, to FIG. 1 thereof, there is shown an LED illumination system 1 according to the exemplifying embodiment, which is schematically represented in section, and is provided for an optimally uniform illumination of a curved surface 5, for instance of a chart.

An LED element 2 on a carrier 3 emits the light needed for illumination during operation. It is immediately apparent to the person skilled in the art that, absent correction of the emitted light, the illumination of the curved surface 5 is not uniform, for several reasons.

First, the emission characteristic of the LED element 2 is not constant over the entire space angle $\Omega$ occupied by the curved surface 5; rather, it has its maximum intensity in an angle range about a main beam direction 9. Second, the distance to the curved surface 5 from the LED element 2 changes; and third, the angle of incidence of the incident radiation also changes with the curvature of the surface 5 along its longitudinal extent.

In order to achieve a substantially uniform illumination of the curved surface 5 nevertheless, a lens 4 is disposed between the curved surface 5 and the LED element 2 as illumination optics, which lens 4 correspondingly deflects the emitted light asymmetrically in relation to the main beam direction 9 of the LED element 2.

The light emitted by the LED element 2, which is represented by geometric light beams 6 indicated by arrows in FIG. 1, has an at least approximately symmetrical intensity distribution relative to the main beam direction 9. The illumination optics 4 deflect the light beams 6 such that they strike the curved surface 5 as asymmetrically distributed light beams 8. To that end, the illumination optics 4 is formed of an asymmetrically shaped lens 4 with a concave surface 41 facing the LED element 2 and a convex, for instance parabolically convex, surface 42 facing the curved surface 5.

The measure of deflection by the lens 4 is proportioned to compensate the above described effects and others which would lead to a non-uniform illumination of the curved surface 5, so that there results a uniform illumination intensity of the curved surface 5. The compensation can occur by way of the selection of the curvature of the outer lens surface 42 and inner lens surface 41, as is known per se from the prior art.

The overall configuration of the LED element 2 and the illumination optics 4 is preferably accommodated in a common module housing 7.

Though the exemplifying embodiment of FIG. 1 has been described with only one LED element for the sake of simplicity, it is obvious to the person skilled in the art that a number of LED elements can also be provided in the illumination system instead of the single LED element. In particular, the LED elements can emit different spectral colors in order to achieve a desired color impression on the illuminated surface 5.

Figure 2:
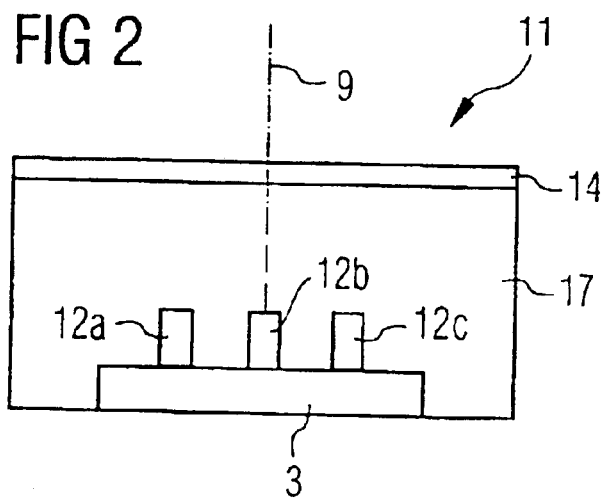
FIG. 2 is a sectional view of the LED illumination system according to a second exemplifying embodiment of the invention.

This is exemplarily realized in an illumination system 11 of FIG. 2, which represents another exemplifying embodiment of the invention. Three LED elements 12a, 12b, 12c emit in the red (650 nm), green (530 nm), and blue (470 nm) spectral ranges, respectively, producing an overall emission of white light. Alternatively, a blue LED can be employed in conjunction with a converter material for converting the blue light into longer-wave radiation for the purpose of white light emission.

The three LED elements 12a-c are installed on the carrier 3 and, like the illumination system 1, intended for the purpose of illuminating a surface that is not illustrated in FIG. 2.

The illumination optics which generate the desired illumination intensity on the illuminated surface are formed by a Fresnel lens 14 in this embodiment. A very flat lens construction can be realized by partitioning the Fresnel lens 14 into radial zones with an approximately equal maximum thickness.

The Fresnel lens 14 can thus form a wall of a module housing 17, and a compact, self-contained construction of the illumination system is realized. The Fresnel lens 14 can simply be replaced by a correspondingly suitable Fresnel lens when another distribution pattern of illumination intensity is wanted.

Figure 3:
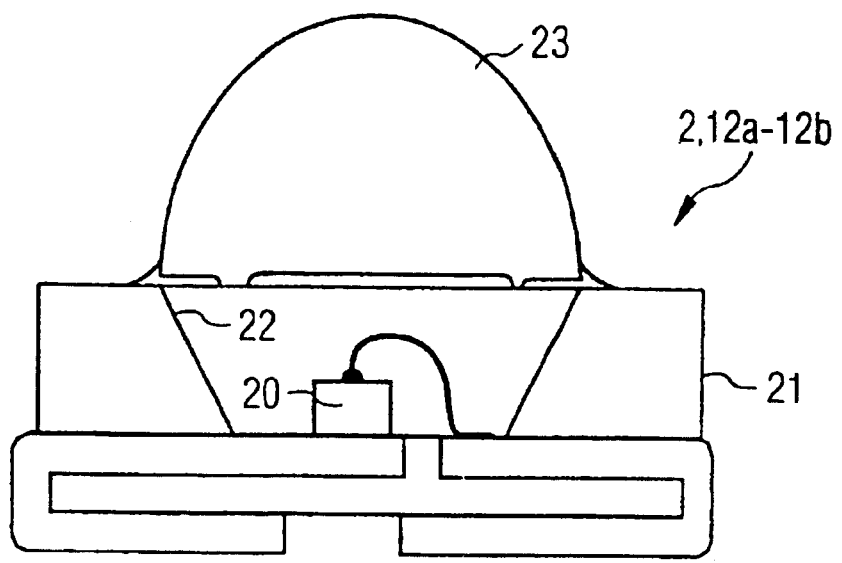
FIG. 3 is a sectional view through a preferred LED element for the illumination system.

Commercial surface-mountable LED components are utilized as the LED elements 2, 12a-c for the above-described exemplifying embodiments and for the invention in general. One such component is schematically represented in FIG. 3. At least one LED semiconductor body 20 is therein disposed in an LED plastic housing 21. The LED semiconductor body 20 is advantageously located in a reflector device 22 of the LED plastic housing 21, which bundles the light emitted by the LED semiconductor body 20. Alternatively or additionally to the reflector device 22, a collecting lens 23, preferably a lens which is fixed on the plastic housing 21, can be disposed behind the semiconductor body 20 in the direction of emission for the purpose of bundling the light which is emitted by the LED semiconductor body 20.

Alternatively, one or several LED semiconductor chips without a housing can be mounted directly in the illumination module on the chip carrier 3 as the LED element. But the module housing 7 must then satisfy higher requirements with respect to tightness than if LED components which are provided with a housing are utilized as described in connection with FIG. 3.

The invention claimed is:

1. An LED illumination system for illuminating a surface with a predetermined illumination intensity distribution, the LED illumination system comprising:
   at least one LED element emitting light symmetrically relative to a main beam direction of said LED element; and
   illumination optics disposed between said LED element and the surface to be illuminated, said illumination optics having a concave surface facing said LED element, a convex surface facing the surface to be illuminated, and deflecting emitted light asymmetrically relative to the main beam direction of said LED element.

2. The LED illumination system according to claim 1, wherein the LED illumination system is configured and intended for a uniform illumination of the surface to be illuminated.

3. The LED illumination system according to claim 1, wherein the LED illumination system is configured and intended for a uniform illumination of a curved surface.

4. The LED illumination system according to claim 3, wherein said illumination optics is formed by an individual lens.

5. The LED illumination system according to claim 3, wherein the curved surface is one of a convex surface and a concave surface.

6. The LED illumination system according to claim 1, wherein said illumination optics include at least one Fresnel lens.

7. The LED illumination system according to claim 1, wherein said LED element contains a semiconductor material selected from the group consisting of GaN, InGaN, AlGaN, InAl, GaN, ZnS, ZnSe, CdZnS, and CdZnSe.

8. The LED illumination system according to claim 1, wherein said LED element is a plurality of LED elements and one of said LED elements emits one of visible light, infrared electromagnetic radiation, and ultraviolet electromagnetic radiation during operation.

9. The LED illumination system according to claim 1, wherein said LED element is one of a plurality of LED elements and several of said LED elements emit in different spectral ranges.

10. The LED illumination system according to claim 9, wherein the emitted light of said LED elements is complementary, and white light is delivered.

11. The LED illumination system according to claim 1, further comprising a common module housing, and said LED element and said illumination optics form an illumination module and are disposed in said common module housing.

12. The LED illumination system according to claim 11, wherein said illumination optics contains a Fresnel lens which forms a wall of said common module housing.

13. The LED illumination system according to claim 1, wherein said LED element is a surface-mountable LED component with a LED plastic housing.

14. The LED illumination system according to claim 13, wherein said LED plastic housing contains a reflector device in which said LED element is disposed.

15. The LED illumination system according to claim 13, wherein said illumination optics is a collecting lens disposed downstream of said LED element in a direction of emission.

16. The LED illumination system according to claim 15, wherein said collecting lens is disposed on said LED plastic housing.

17. The LED illumination system according to claim 1, wherein said convex surface is a convex parabola.

18. An LED illumination system comprising:
   at least one LED element having a surface-mountable LED component with a LED plastic housing, said at least one LED element emitting light symmetrically relative to a main beam direction of said LED element; and
   illumination optics disposed between said LED element and a curved surface to be illuminated, said illumination optics deflecting emitted light asymmetrically relative to the main beam direction of said LED element to illuminate said curved surface with a substantially uniform illumination intensity distribution.

* * * * *